US011500285B2

(12) United States Patent
Bozano et al.

(10) Patent No.: US 11,500,285 B2
(45) Date of Patent: *Nov. 15, 2022

(54) MULTIFUNCTIONAL POLYMERS (71) Applicants: International Business Machines Corporation, Armonk, NY (US); Shin-Etsu Chemical Co., Ltd., Joetsu (JP)

(72) Inventors: Luisa D. Bozano, Los Gatos, CA (US); Daisuke Domon, Joetsu (JP); Yoshio Kawai, Joetsu (JP); Keiichi Masunaga, Joetsu (JP); Martha I. Sanchez, Menlo Park, CA (US); Daniel P. Sanders, San Jose, CA (US); Ratnam Sooriyakumaran, San Jose, CA (US); Linda K. Sundberg, Los Gatos, CA (US); Satoshi Watanabe, Joetsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/158,103

(22) Filed: Oct. 11, 2018

(65) Prior Publication Data

US 2020/0278607 A1 Sep. 3, 2020

Related U.S. Application Data (63) Continuation of application No. 14/479,378, filed on Sep. 8, 2014, now Pat. No. 10,345,700.

(51) Int. Cl.
*G03F 7/20* (2006.01)
*G03F 7/038* (2006.01)
(Continued)

(52) U.S. Cl.
CPC .......... *G03F 7/0045* (2013.01); *C08F 212/24* (2020.02); *G03F 7/0046* (2013.01);
(Continued)

(58) Field of Classification Search
CPC ... C07C 381/12; C07C 309/12; C07D 307/77; C07D 7/77; G03F 7/039; G03F 7/2041;
(Continued)

(56) References Cited

U.S. PATENT DOCUMENTS 178,806 A 6/1876 Sinclair
209,922 A 11/1878 Richards
(Continued)

FOREIGN PATENT DOCUMENTS

CN 102321212 A 1/2012
CN 106662810 A 8/2020
(Continued)

OTHER PUBLICATIONS

Machine translation of JP 2013-254081 (Dec. 2013).*
(Continued)

*Primary Examiner* — Martin J Angebranndt
(74) *Attorney, Agent, or Firm* — Kelsey M. Skodje (57) ABSTRACT A negative-tone resist composition is provided that contains a free photoacid generator and a multifunctional polymer covalently bound to a photoacid-generating moiety, where the composition is substantially free of cross-linking agents. Multifunctional polymers useful in conjunction with the resist composition are also provided, as is a process for generating a resist image on a substrate using the present compositions and polymers.

9 Claims, 2 Drawing Sheets (51) Int. Cl.
 *G03F 7/32* (2006.01)
 *G03F 7/004* (2006.01)
 *C08F 220/18* (2006.01)
 *C08F 220/30* (2006.01)
 *C08F 220/24* (2006.01)
 *C08F 212/14* (2006.01)

(52) U.S. Cl.
 CPC .............. *G03F 7/0382* (2013.01); *G03F 7/20* (2013.01); *G03F 7/322* (2013.01)

(58) Field of Classification Search
 CPC ........ G03F 7/20; G03F 7/0045; C08F 220/18; C08F 220/30
 See application file for complete search history.

(56) References Cited

U.S. PATENT DOCUMENTS

| | | | |
|---|---|---|---|
| 212,390 | A | 2/1879 | Lobenstein |
| 212,810 | A | 3/1879 | Levi |
| 219,888 | A | 9/1879 | Wilhelm |
| 4,399,233 | A | 8/1983 | Duranleau |
| 6,383,715 | B1 | 5/2002 | Lu |
| 7,078,044 | B2 | 7/2006 | Lamanna |
| 7,078,444 | B2 | 7/2006 | Lamanna |
| 7,563,558 | B2 | 7/2009 | Allen |
| 7,812,105 | B2 | 10/2010 | Nagai |
| 8,663,897 | B2 | 3/2014 | Masubucki et al. |
| 8,795,948 | B2 | 8/2014 | Dazai et al. |
| 9,005,874 | B2 | 4/2015 | Komuro et al. |
| 9,023,587 | B2 * | 5/2015 | Hatakeyama ........... C08F 20/16 526/329.2 |
| 9,436,083 | B2 | 9/2016 | Domon |
| 9,632,417 | B2 | 4/2017 | Kumaki |
| 9,645,493 | B2 | 5/2017 | Domon |
| 9,740,098 | B2 | 8/2017 | Masunaga |
| 9,904,169 | B2 * | 2/2018 | Adachi .................. G03F 7/0045 |
| 10,345,700 | B2 * | 7/2019 | Bozano .................. G03F 7/0045 |
| 11,231,650 | B2 * | 1/2022 | Kotake ................. C09D 125/18 |
| 2003/0138724 | A1 * | 7/2003 | Nozaki ............... H01L 21/0274 430/270.1 |
| 2003/0165772 | A1 * | 9/2003 | Takahashi ............. G03F 7/0382 430/270.1 |
| 2005/0175928 | A1 | 8/2005 | Li |
| 2007/0141510 | A1 | 6/2007 | Chen |
| 2008/0102407 | A1 | 5/2008 | Ohsawa et al. |
| 2009/0011365 | A1 | 1/2009 | Kobayashi et al. |
| 2010/0055608 | A1 | 3/2010 | Ohashi et al. |
| 2010/0099042 | A1 | 4/2010 | Ohashi et al. |
| 2010/0297560 | A1 | 11/2010 | Seshimo et al. |
| 2011/0212390 | A1 | 9/2011 | Masunaga et al. |
| 2011/0229832 | A1 | 9/2011 | Kamimura |
| 2012/0077120 | A1 | 3/2012 | Prokopowicz |
| 2012/0164576 | A1 | 6/2012 | Hayashi |
| 2012/0214100 | A1 | 8/2012 | Kobayashi |
| 2012/0219888 | A1 | 8/2012 | Masunaga et al. |
| 2012/0308920 | A1 | 12/2012 | Domon et al. |
| 2012/0322006 | A1 | 12/2012 | Kato et al. |
| 2013/0004739 | A1 | 1/2013 | Odani |
| 2013/0209922 | A1 | 8/2013 | Masunaga et al. |
| 2013/0288180 | A1 | 10/2013 | Hatakeyama |
| 2014/0178806 | A1 | 6/2014 | Tsuchimura et al. |
| 2014/0212810 | A1 | 7/2014 | Hatakeyama et al. |
| 2016/0070169 | A1 | 3/2016 | Bozano |
| 2016/0090355 | A1 | 3/2016 | Domon |
| 2016/0229940 | A1 * | 8/2016 | Hatakeyama ......... C08F 228/02 |
| 2016/0299431 | A1 | 10/2016 | Adachi |
| 2017/0059990 | A1 * | 3/2017 | Tsuchimura .......... C08F 212/14 |
| 2019/0361347 | A1 * | 11/2019 | Domon .................. C07C 69/54 |
| 2020/0133121 | A1 * | 4/2020 | Domon .................... G03F 1/78 |

FOREIGN PATENT DOCUMENTS

| | | |
|---|---|---|
| GB | 2543681 A | 7/2017 |
| JP | 2003-337414 A1 | 11/2003 |
| JP | 2008-249951 A1 | 10/2008 |
| JP | 2011150211 A | 8/2011 |
| JP | 2012037774 A | 2/2012 |
| JP | 2013-164588 A | 8/2013 |
| JP | 2013-254081 | * 12/2013 |
| JP | 2014-145885 A | 8/2014 |
| KR | 20170010854 A | 2/2017 |
| TW | 201616224 A | 5/2016 |
| WO | 2010044372 A1 | 4/2010 |
| WO | 2013/031686 A1 | 3/2013 |
| WO | 2015125514 A1 | 8/2015 |
| WO | 2015129275 A1 | 9/2015 |
| WO | 2015/194330 A | 12/2015 |
| WO | 2016038476 A1 | 3/2016 |

OTHER PUBLICATIONS

International Search Report and Written Opinion of corresponding PCT Patent Application No. PCT/IB2015/055621 dated Dec. 15, 2015.
Ito et al., "Dual-tone and aqueous base developable negative resist based upon acid-catalyzed dehydration in Polymeric Materials for Microelectronic Applications", ACS SYMP series pp. 70-92 (1995).
Translation of JP 2003-337 414 (2003).

* cited by examiner

FIG. 1

EUV and E-beam Resolution for 40 nm Thick Film of Composition No. 22 in Table 2

EUV Met Tool

26nm 1:1, 13.1 mJ

E-beam Leica VB6 100KEV

25nm 1:1, 67 µC/cm²

FIG. 2
Resist Performance and Defect Profile

MULTIFUNCTIONAL POLYMERS

CROSS-REFERENCE TO RELATED APPLICATION

This is a continuation of U.S. patent application Ser. No. 14/479,378, filed Oct. 11, 2014.

PARTIES TO A JOINT RESEARCH AGREEMENT

The present disclosure, including the claimed invention, was made by or on behalf of the below listed parties to a joint research agreement. The joint research agreement was in effect on or before the date the present disclosure was made and the present disclosure was made as a result of activities undertaken within the scope of the joint research agreement. The parties to the joint research agreement are 1) International Business Machines Corporation and 2) Shin-Etsu Chemical Co., Ltd.

TECHNICAL FIELD

The present invention relates to resist compositions and more specifically to negative tone resist compositions developable with an aqueous base. The invention additionally relates to polymers and polymer compositions useful in such resist compositions. The invention finds utility in the fields of lithography and semiconductor device fabrication.

BACKGROUND

The semiconductor fabrication technique of microlithography defines the high resolution circuitry in a semiconductor device by exposing a photoresist on a substrate to radiation. A photoresist composition (also referred to herein as "photoresist" or simply "resist") typically comprises a polymeric matrix, a radiation-sensitive component, a casting solvent, and other performance-enhancing additives. In practice, the resist is spin-coated onto a silicon wafer to form a coating that is typically 30 to 500 nm in thickness. The film is then heated to remove residual solvents; this step is generally referred to as post-apply bake, or PAB. The film is then exposed pattern-wise to radiation and, optionally, heated (in a step referred to as post-exposure bake, or PEB) to induce a chemical transformation that renders the solubility of the exposed areas of the film to be different from the solubility of the unexposed areas. The radiation used for exposure has typically been ultraviolet light with wavelengths ranging from the near ultraviolet (UV) to the deep UV (DUV) and extreme UV (EUV), thus including wavelengths of, for example, 436, 365, 257, 248, 193 or 13.5 nanometers (nm). Shorter wavelengths are currently preferred because of the higher resolution provided. A beam of electrons or ions, also known as "E-beam radiation" or "ion beam radiation," respectively, has also been used. After exposure, the resist film is developed with a solvent to generate the resist image on the wafer. The resist is classified as a positive-tone resist (PTR) or a negative-tone resist (NTR) depending on the tone of the final image that is created. In positive-tone imaging, the exposed area of the resist film is rendered more soluble in the developer than the unexposed area, while in negative-tone imaging, it is the unexposed areas that are more soluble in the developer than the exposed areas.

Resists used with UV, DUV, EUV, and E-beam radiation generally require the use of chemical amplification in order to increase resist sensitivity, such that an agent (e.g., an acidic agent, termed a "photoacid") that is generated by the interaction of the exposure radiation with a photoacid generator (PAG) acts as a catalyst to effect multiple reactions in the polymer structure, rendering the resist polymer more or less soluble in the developer, depending on the type of resist.

While most resist processing has typically involved PTRs, there has been an increased interest in developing NTRs in order to improve imaging performance and/or the process window of the resist at a particular masking level. There is still a dearth of chemically amplified negative-tone resist compositions, particularly for E-beam and EUV applications. Most of the current negative resists are based on acid-catalyzed cross-linking of polar functional groups. Such negative resists have not achieved equivalent performance to that of chemically amplified positive resists due to the inherent shortcomings in the cross-linking mechanism. Cross-linked polymers tend to swell in the developer, leading to imperfect images, resulting in micro-bridging between features. This becomes a critical issue for E-beam and EUV applications in particular, where high resolution and low line edge roughness (LER) are requirements.

An alternative approach was followed to prepare a negative-tone resist based on a polarity change mechanism wherein a photo-generated acid catalyzes the elimination of a polar functionality to decrease the dissolution rate of the resist in an aqueous base developer. This approach is described in US Patent Publication No. 2013/0209922 A1 to Masunaga et al., in which a high resolution negative resist based on compositions incorporating an acid-removable hydroxyl group is described. The aforementioned resists provided high resolution and low LER, but when defectivity tested, exhibited significant numbers of "blob-like" defects ranging in size from about 1 mm to about 5 mm in the unexposed regions of the wafer or mask substrate. The term "blob-like" defect refers to a streak, chain, or concentrated region of smaller defects, or to an agglomeration of smaller defects. Various process modifications were attempted to address the problem, but none sufficiently reduced the number or size of the defects. Lower molecular weight polymers, higher molecular weight polymers, and different polarity switching units were also tried, without success.

PAG-bound polymers have been reported in positive resist compositions in order to improve the lithographic performance; see, e.g., U.S. Pat. No. 7,812,105 to Nagai et al. A negative resist composition based on cross-linking chemistry using a PAG-bound polymer has also been reported, in U.S. Patent Publication No. 2012/0219888 A1.

SUMMARY

It is an object of the invention to provide an aqueous base developable negative-tone resist composition substantially free of cross-linking agents and comprising: a multifunctional polymer comprised of first recurring units that impart solubility in aqueous base developer, second recurring units containing a polarity switching moiety, and third recurring units containing a covalently attached photoacid-generating group.

It is another object of the invention to provide such a negative-tone resist composition that, in addition to the multifunctional polymer, contains free PAG, i.e., PAG that is not covalently bound to the multifunctional polymer or to any other polymer in the composition.

It is a further object of the invention to provide such a negative tone resist composition that, in addition to the multifunctional polymer, contains a polymer that does not contain a covalently attached photoacid-generating group.

It is an additional object of the invention to provide a multifunctional polymer comprising:

(a) first recurring units comprising an aqueous base soluble functionality selected from phenols, fluoroalcohols, and sulfonamides, providing the polymer with aqueous base solubility;

(b) second recurring units containing a polarity switching functionality that converts from a polar group to a nonpolar group in the presence of acid;

(c) third recurring units that are covalently bound to a photoacid-generating group that generates a polymer-bound acid on exposure to radiation.

It is yet another object of the invention to provide a multifunctional polymer comprising:

(a) first recurring units providing the polymer with aqueous base solubility, comprising a phenolic unit having the structure of formula (I)

(I)

wherein $R^1$ is selected from H, fluoro, $C_1$-$C_3$ alkyl, and fluorinated $C_1$-$C_3$ alkyl, $R^2$ is selected from fluoro, hydroxyl, $C_1$-$C_3$ alkyl, and fluorinated $C_1$-$C_3$ alkyl, and m is an integer in the range of zero to 4 inclusive, and when m is greater than 1, the $R^2$ may be the same or different;

(b) second recurring units that serve as polarity-switching units, having the structure of formula (II)

(II)

wherein:
n, p, and q are independently selected from zero and 1;
$R^3$ is $C_1$-$C_{15}$ alkyl and $R^4$ is either H or $C_1$-$C_{15}$ alkyl, or $R^3$ and $R^4$ taken together form a cyclic group;
$R^5$ is selected from H, fluoro, $C_1$-$C_3$ alkyl, and fluorinated $C_1$-$C_3$ alkyl;
X and Y are independently selected from $C_1$-$C_{10}$ alkylene and heteroatom-containing $C_1$-$C_{10}$ alkylene; and
Ar is an arylene moiety; and (c) third recurring units that are covalently bound to a photoacid-generating group that generates acid on exposure to radiation.

The polymer may or may not contain additional types of recurring units.

The negative-tone resist composition of the invention is useful in processes for generating a negative resist image on a substrate by: (a) coating a substrate with a film of a negative-tone resist composition of the invention and preferably baking (via post-apply bake, or "PAB") the film to remove residual solvents; (b) exposing the film selectively to a predetermined pattern of radiation and optionally heat treating (via post-exposure bake, or "PEB") so as to form a latent, patterned image in the film; and (c) developing the latent image with an aqueous base developer. These negative-tone resist compositions are chemically amplified, and find utility in conjunction with a wide range of irradiation wavelengths including DUV and EUV radiation as well as E-beam and ion beam radiation. The compositions achieve the advantages set forth in US Patent Publication No. 2013/0209922 A1 to Masunaga et al. without giving rise to the defects associated therewith.

DETAILED DESCRIPTION

I. Definitions and Nomenclature

Unless otherwise indicated, this invention is not limited to specific compositions, components, or process steps. It should also be noted that the singular forms "a," "and," and "the" are intended to encompass plural referents, unless the context clearly dictates otherwise. The terminology used herein is for the purpose of describing particular embodiments only and is not intended to be limiting.

In this specification and in the claims that follow, reference will be made to a number of terms, which shall be defined to have the following meanings:

As used herein, the phrase "having the formula" or "having the structure" is not intended to be limiting and is used in the same way that the term "comprising" is commonly used.

The term "hydrocarbyl" refers to univalent hydrocarbyl radicals containing 1 to about 15 carbon atoms, preferably 1 to about 12 carbon atoms, including linear, branched, cyclic, saturated and unsaturated species, such as alkyl groups, alkenyl groups, aryl groups, and the like. "Substituted hydrocarbyl" refers to hydrocarbyl substituted with one or more substituent groups, and the term "heteroatom-containing hydrocarbyl" refers to hydrocarbyl in which at least one carbon atom is replaced with a heteroatom. Unless otherwise indicated, the term "hydrocarbyl" is to be interpreted as including substituted and/or heteroatom-containing hydrocarbyl moieties.

The term "alkyl" as used herein refers to a straight or branched, saturated alkyl group typically although not necessarily containing 1 to about 15 carbon atoms, such as methyl, ethyl, n-propyl, isopropyl, n-butyl, isobutyl, t-butyl, octyl, decyl, and the like. Generally, although not necessarily, alkyl groups herein contain 1 to about 12 carbon atoms. The term "lower alkyl" means an alkyl group of 1 to 6 carbon atoms, preferably 1 to 3 carbon atoms, and the term "cycloalkyl" means a cyclic alkyl group, typically having 4 to 8, preferably 5 to 7, carbon atoms. The term "substituted alkyl" refers to alkyl substituted with one or more substituent groups, and the terms "heteroatom-containing alkyl" and "heteroalkyl" refer to alkyl in which at least one carbon atom is replaced with a heteroatom, e.g., O, S, or N, generally although not necessarily O. If not otherwise indicated, the terms "alkyl" and "lower alkyl" include linear, branched, unsubstituted, substituted, and/or heteroatom-containing alkyl and lower alkyl, respectively. Unless otherwise indicated, the term "alkyl" includes substituted alkyl and/or heteroatom-containing alkyl.

The term "alkylene" refers to a bivalent saturated aliphatic radical group typically although not necessarily containing 1 to about 15 carbon atoms, and preferably containing 1 to about 12 carbon atoms. Unless otherwise indicated, the term "alkylene" includes substituted alkylene and/or heteroatom-containing alkylene. The term "aryl" as used herein refers to an aromatic substituent containing one to three aromatic rings, either fused or linked, and either unsubstituted or substituted with one or more substituents. Unless otherwise indicated, the term "aryl" includes substituted aryl and/or heteroatom-containing aryl. Typically, aryl groups herein contain about 5 to about 20 carbon atoms, and thus include, by way of example, phenyl, naphthyl, and the like.

The term "arylene" refers to a bivalent aromatic group, containing one to three aromatic rings, either fused or linked, and either unsubstituted or substituted with one or more substituents. Unless otherwise indicated, the term "arylene" includes substituted arylene and/or heteroatom-containing arylene.

The term "alicyclic" is used to refer to cycloalkanes and cycloalkenes, including cycloalkyl and cycloalkenyl substituents and cycloalkylene and cycloalkenylene linkages. Often, the term refers to bridged bicyclic compounds, substituents, and linkages. Preferred alicyclic moieties herein contain 3 to about 15 carbon atoms. Unless otherwise indicated, the term "alicyclic" includes substituted and/or heteroatom-containing such moieties.

The term "heteroatom-containing" as in a "heteroatom-containing alkyl group" (also termed a "heteroalkyl" group) or a "heteroatom-containing aryl group" (also termed a "heteroaryl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing, the terms "heteroaryl" and heteroaromatic" respectively refer to "aryl" and "aromatic" substituents that are heteroatom-containing, and the like.

The term "substituted" as in "substituted alkyl," "substituted aryl," and the like, as alluded to in some of the present definitions, means that in the alkyl, aryl, or other moiety, at least one hydrogen atom bound to a carbon (or other) atom is replaced with a non-hydrogen substituent. Examples of such substituents include, without limitation, functional groups such as halide, hydroxyl, alkoxy, acyl (including alkylcarbonyl (—CO— alkyl) and arylcarbonyl (—CO-aryl)), acyloxy (—O—CO—), alkoxycarbonyl (—(CO)—O-alkyl), aryloxycarbonyl (—(CO)—O-aryl), and silyl (e.g., trialkylsilyl); hydrocarbyl moieties such as alkyl, aryl, aralkyl (aryl-substituted alkyl), and alkaryl (alkyl-substituted aryl); and substituted hydrocarbyl moieties such as halide-substituted hydrocarbyl groups, particularly fluorinated hydrocarbyl groups. The aforementioned functional groups may, if a particular group permits, be further substituted with one or more additional functional groups or with one or more hydrocarbyl moieties such as those specifically enumerated above, and analogously, the above-mentioned hydrocarbyl moieties may be further substituted with one or more functional groups or additional hydrocarbyl moieties such as those specifically enumerated.

The term "fluorinated" refers to replacement of a hydrogen atom in a molecule or molecular segment with a fluorine atom. The term "fluoroalkyl" refers to an alkyl group wherein at least one hydrogen atom has been replaced with a fluorine atom and includes, for example, trifluoromethyl, difluoromethyl, 2,2,2-trifluoroethyl, pentafluromethyl, 3,3,3-trifluoromethyl, etc. Similarly, the term "fluorocarbinol" refers to an alcohol moiety in which at least one of the hydrogens bonded to a carbon atom has been replaced with a fluorine atom and includes, for example, —CF$_2$OH, —CH(CF$_3$)—OH, —C(CF$_3$)$_2$—OH, —CH$_2$CF$_2$OH, etc. The term "perfluorinated" is also used in its conventional sense to refer to a molecule or molecular segment wherein all hydrogen atoms are replaced with fluorine atoms. Unless otherwise indicated, "fluorinated" substituents (such as fluoroalkyl and the like) include perfluorinated substituents.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The terms "photogenerated acid" and "photoacid" are used interchangeably herein to refer to the acid that is created upon exposure of the photoacid generator (PAG) in the present compositions to radiation.

The term "radiation" is intended to encompass UV radiation, DUV radiation, EUV radiation, E-beam, ion beam, x-ray, excimer laser, γ-ray and synchrotron radiation.

The term "polymer" is used to refer to a chemical compound that comprises linked monomers, and that may be straight, branched, or crosslinked. The term also encompasses homopolymers, copolymers, terpolymers, tetrapolymers, and the like. Any polymers identified as containing more than one type of recurring unit, i.e., a copolymer, terpolymer, tetrapolymer, or the like, are not intended to be limited with respect to configuration. That is, for example, copolymers herein may be block copolymers, alternating copolymers, random copolymers, terpolymers may be block terpolymers, random terpolymers, and the like.

For additional information concerning terms used in the field of lithography and lithographic compositions, see Introduction to Microlithography, Eds. Thompson et al. (Washington, D.C.: American Chemical Society, 1994).

II. Resist Compositions

The negative-tone resist compositions of the invention contain a multifunctional polymer that are composed of at least three types of recurring units: (a) first recurring units that provide the polymer with solubility in aqueous base; (b) second recurring units having a polarity switching functionality that converts from a polar group to a nonpolar group in the presence of acid; and (c) third recurring units containing a photoacid-generating group that generates an acid on exposure to radiation. The resist may also contain a free photoacid generator, i.e., photoacid generator that is not covalently bound to the aforementioned polymer. Generally, the multifunctional polymer comprises about 50 mol % to about 80 mol % of recurring unit (a), about 10 mol % to about 40 mol % of recurring unit (b), and about 1 mol % to about 10 mol % of recurring unit (c). The composition is substantially free of cross-linking agents. By "substantially free of cross-linking agents" is meant that the composition contains less than about 5 wt. %, preferably less than about 1 wt. %, still more preferably less than about 0.1 wt. %, and optimally less than about 0.01 wt. % cross-linking agents.

The multifunctional polymer generally has a carbon backbone; the carbon atoms within the backbone may be unsubstituted or substituted with one or more non-hydrogen moieties as will be discussed below with respect to the structures of the recurring units.

The first recurring unit provides the polymer with solubility in aqueous base by virtue of containing an aqueous base soluble functionality. In particular, the aqueous base soluble functionality renders the polymer soluble in the aqueous base developer used to develop the latent image in the post-exposure resist film, e.g., a tetramethylammonium hydroxide (TMAH), tetrabutylammonium hydroxide (TBAH), or potassium hydroxide solution. By way of illustration, the aqueous base soluble functionality may be a substituted or unsubstituted phenol, fluoroalcohol, or sulfonamide.

Generally, the first recurring unit comprises a phenolic unit having the structure of formula (I)

(I)

wherein $R^1$ is selected from H, fluoro, $C_1$-$C_3$ alkyl, and fluorinated $C_1$-$C_3$ alkyl, $R^2$ is independently selected from fluoro, hydroxyl, $C_1$-$C_3$ alkyl, and fluorinated $C_1$-$C_3$ alkyl, and m is an integer in the range of zero to 4 inclusive. Examples thus include, without limitation, units in which $R^1$, $R^2$, and m are as follows:

$R^1$ is H, m is zero (such that the unit derives from 4-hydroxystyrene);
$R^1$ is H, m is 1, and $R^2$ is o-methyl;
$R^1$ is H, m is 1, and $R^2$ is m-methyl;
$R^1$ is H, m is 2, and the $R^2$ are 3,5-dimethyl;
$R^1$ is H, m is 2, and the $R^2$ are 3,5-di(trifluoromethyl);
$R^1$ is F, m is zero;
$R^1$ is F, m is 1, and $R^2$ is o-methyl;
$R^1$ is F, m is 1, and $R^2$ is m-methyl;
$R^1$ is F, m is 2, and the $R^2$ are 3,5-dimethyl;
$R^1$ is F, m is 2, and the $R^2$ are 3,5-di(trifluoromethyl);
$R^1$ is $CH_3$, m is zero;
$R^1$ is $CH_3$, m is 1, and $R^2$ is o-methyl;
$R^1$ is $CH_3$, m is 1, and $R^2$ is m-methyl;
$R^1$ is $CH_3$, m is 2, and the $R^2$ are 3,5-dimethyl;
$R^1$ is $CH_3$, m is 2, and the $R^2$ are 3,5-di(trifluoromethyl);
$R^1$ is $CF_3$, m is zero;
$R^1$ is $CF_3$, m is 1, and $R^2$ is o-methyl;
$R^1$ is $CF_3$, m is 1, and $R^2$ is m-methyl;
$R^1$ is $CF_3$, m is 2, and the $R^2$ are 3,5-dimethyl; and
$R^1$ is $CF_3$, m is 2, and the $R^2$ are 3,5-di(trifluoromethyl).

It will be appreciated by those of ordinary skill in the art that suitable additional units can be constructed using various combinations of $R^1$, $R^2$, and m as defined above.

The second recurring unit contains a polarity switching functionality that converts from a polar group to a nonpolar group in the presence of acid, particularly photoacid generated by the third recurring unit as will be explained infra. The second recurring unit has a general structure represented by formula (II):

(II)

In formula (II):

The values of n, p, and q are independently selected from zero and 1, meaning that the carbonyloxy, X, and Y moieties are optional.

$R^3$ is $C_1$-$C_{15}$ alkyl and $R^4$ is either H or $C_1$-$C_{15}$ alkyl, typically $C_1$-$C_{10}$ alkyl, or $R^3$ and $R^4$ taken together to form a cyclic group. For example, $R^3$ may be methyl, ethyl, propyl, isopropyl, n-butyl, cyclohexyl, 1-methylcyclohexyl, 2-methylcyclohexyl, 2,4-dimethylcyclohexyl, cyclopentyl, or the like, and $R^4$ may be H or any of the aforementioned representative $C_1$-$C_{15}$ alkyl groups. When $R^3$ and $R^4$ are taken together to form a cyclic group, the group is generally an alicyclic group having five or six ring carbon atoms or a bicyclic or multicyclic group in which two or more such alicyclic groups are fused or linked.

$R^5$ is selected from H, fluoro, $C_1$-$C_3$ alkyl, and fluorinated $C_1$-$C_3$ alkyl, and may therefore be, for example, H, fluoro, methyl, ethyl, n-propyl, isopropyl, monofluoromethyl, difluoromethyl, trifluoromethyl, and a partially or fully fluorinated ethyl, n-propyl, or isopropyl group.

X and Y are independently selected from $C_1$-$C_{10}$ alkylene and heteroatom-containing $C_1$-$C_{10}$ alkylene, and if heteroatom-containing $C_1$-$C_{10}$ alkylene, the heteroatom will be N (as N—H, N—$C_1$-$C_3$ alkyl), S, or O, preferably O.

Ar is arylene as defined earlier herein. In one embodiment, Ar is an optionally substituted phenylene ring, and p and q are 1, such that the unit has the structure of formula (II-A)

(II-A)

in which $R^3$, $R^4$, $R^5$, X, Y, and n are as defined above with respect to formula (II), t is an integer in the range of zero to 4 inclusive, preferably zero, 1, or 2, and $R^6$ is selected from fluoro, hydroxyl, $C_1$-$C_3$ alkyl, and fluorinated $C_1$-$C_3$ alkyl.

In another embodiment, Ar is an optionally substituted phenylene ring and n, p and q are zero, such that the unit has the structure of formula (II-B)

(II-B)

In the above structure, $R^3$, $R^4$, $R^5$, and $R^6$ are as defined above with respect to formulae (II) and (II-A). It will be appreciated that structure (II-B) corresponds to a monomer unit of poly[4-(-2-hydroxy-2-propyl)styrene] when $R^3$ and $R^4$ are methyl, $R^5$ is H and t is zero.

The third recurring unit contains a photoacid-generating group that generates an acid on exposure to radiation. Any such unit may be employed provided that it does not render the polymer incompatible with the photolithographic process or resist composition as a whole, for instance by introducing problems with solubility or reactivity. A generally preferred photoacid-generating unit has the structure of formula (III-A) or (III-B):

(III-A)

(III-B)

In formula (III-A):

$R^{12}$ is selected from H, fluoro, hydroxyl, $C_1$-$C_3$ alkyl, and fluorinated $C_1$-$C_3$ alkyl, and is preferably H, fluoro, methyl, or trifluoromethyl.

$R^7$ and $R^8$ are independently selected from H, fluoro, and fluorinated $C_1$-$C_3$ alkyl, and are preferably H, fluoro, trifluoromethyl, or pentafluoroethyl.

$R^9$, $R^{10}$, and $R^{11}$ are independently selected from $C_1$-$C_{10}$ alkyl, $C_2$-$C_{10}$ alkenyl, $C_6$-$C_{18}$ aryl, and $C_7$-$C_{24}$ aralkyl, any of which may be heteroatom-containing and/or substituted. Alternatively, two or three of $R^9$, $R^{10}$, and $R^{11}$ may be taken together to form a ring containing, as a heteroatom, the sulfur atom to which they are bound.

Z is a $C_1$-$C_{10}$ divalent hydrocarbon group that is optionally substituted with F or $CF_3$, and may be heteroatom-substituted, e.g., containing an ether linkage.

In formula (III-B):

$R^{13}$ is as defined for $R^{12}$;

$R^{14}$, $R^{15}$, and $R^{16}$ are as defined for $R^9$, $R^{10}$, and $R^{11}$; and W is selected from $C_1$-$C_{10}$ alkylene and $C_6$-$C_{18}$ arylene, either of which may be heteroatom-containing and/or substituted, e.g., containing an ether linkage.

The multifunctional polymer may contain one or more additional types of recurring units. A preferred such unit is a fourth recurring unit derived from an aromatic ring bearing cyclic olefin monomer, i.e., converted to a recurring unit by copolymerization with the other monomers. In a particularly preferred embodiment, the recurring unit is derived from acenaphthylene and thus has the structure of formula (IV)

(IV)

wherein f and g are independently zero to 3, typically zero to 2, and $R^{17}$ and $R^{18}$ are independently selected from fluoro, hydroxyl, $C_1$-$C_3$ alkyl, and fluorinated $C_1$-$C_3$ alkyl.

It will be appreciated that the multifunctional polymer may be designed by selecting recurring units each having one or more of the above-described functions, i.e., aqueous base solubility, polarity-switching, and photoacid generation, and then determining a formulation ratio of individual recurring units so as to provide the resist film ultimately prepared with the desired resolution. In this regard, and as noted above, the multifunctional polymer preferably comprises: about 50 mol % to about 80 mol % of the first recurring unit that provides the polymer with solubility in aqueous base (e.g., a recurring unit having the structure of formula (I)), about 10 mol % to about 40 mol % of a second recurring unit containing a polarity-switching functionality and having the structure of formula (II), and about 1 mol % to about 10 mol % of a third recurring unit containing a photoacid-generating moiety, with examples of such third recurring units provided by formula (III-A) and (III-B). If the fourth recurring unit is present, it will typically represent about 1 mol % to about 15 mol % of the polymer.

A representative resist composition of the invention contains a mixture of at least two polymers, with a first polymer comprising recurring units of types (I), (II), (III) and (IV) and a second polymer containing recurring units of types (I), (II), and (IV). In one embodiment of such a resist composition, the composition additionally includes about 1 wt. % to about 12.5 wt. % free PAG.

The multifunctional polymer is used as the base polymer in the negative-tone resist composition of the invention. The polymer is soluble in an alkaline developer (e.g., 2.38 wt. % TMAH, as is typically used), functions to provide adhesion to substrates and etch resistance, and eliminates or minimizes defects seen with prior systems, as described earlier herein.

The multifunctional polymer can be obtained in a standard way by performing copolymerization of corresponding monomers while combining protection and deprotection reactions if necessary. The preferred copolymerization reaction is radical polymerization of vinyl monomers, but other polymerization methods may be employed, as will be appreciated by those of ordinary skill in the art.

The polymer preferably has a weight average molecular weight (Mw) of 1,000 to 50,000, and more preferably 1,000 to 20,000 as measured by gel permeation chromatography (GPC) versus polystyrene standards. A polymer with an Mw of less than 1,000 may be reduced in resolution and form a pattern having a rounded top and degraded line edge roughness (LER). A polymer with an Mw in excess of the range tends to increase LER, though depending on the pattern to be resolved. It is recommended although not essential that the Mw be 20,000 or less, particularly when a pattern having a line width of up to 100 nm is formed.

The polymer preferably has a narrow Polydispersity Index (PDI) as evaluated by the ratio of Mw to Mn, typically in the range of 1.0 to 3.0, more preferably 1.0 to 25.

As the "base" polymer in the present resist composition, a blend of different polymers may be used. The resist composition may contain a single polymer in the form of the multifunctional polymer just described, or it may contain the multifunctional polymer in combination with one or more additional polymers. In one embodiment, the resist composition comprises the multifunctional polymer with the first, second, third, and optionally fourth recurring units in combination with an additional polymer comprised of the first, second, and fourth recurring units, i.e., an additional polymer not containing a PAG-bound recurring unit.

In addition to the multifunctional polymer and any additional polymers, the resist composition contains about 1 wt. % to about 12.5 wt. % free PAG, i.e., PAG that is not covalently bound to any recurring units in any polymer. It is the combination of the free PAG and the PAG-bound polymers that enables a substantially defect-free in the unexposed regions of the wafer or mask substrate and yields improved resist performance. Any suitable PAG known to those of ordinary skill in the art of photolithography may be used, providing that it is compatible with the polymers, compositions, and processes described herein. As is understood in the art, suitable PAGs are compounds that, upon exposure to radiation, generate a strong acid and are compatible with the other components of the resist composition. Examples of suitable PAGs include, but are not limited to, α-(trifluoromethylsulfonyloxy)-bicyclo [2.2.1]hept-5-ene-2, 3-dicarboximide (MDT), onium salts, aromatic diazonium salts, sulfonium salts, diaryliodonium salts and sulfonic acid esters of N-hydroxyamides or N-hydroxyimides, as described in U.S. Pat. No. 6,200,726 to Chen et al. Also, a PAG that produces a weaker acid such as the dodecane sulfonate of N-hydroxy-naphthalimide (DDSN) may be used. Combinations of PAGs may also be used. Generally, suitable acid generators have high thermal stability (are preferably stable to temperatures greater than 140° C.) so they are not degraded during pre-exposure processing. In addition to MDT and DDSN, suitable sulfonate compounds are sulfonate salts, but other suitable sulfonate PAGs include sulfonated esters and sulfonyloxy ketones. See U.S. Pat. No. 5,344,742 to Sinta et al., and J. Photopolym. Sci. and Tech., 4:337 (1991), for examples of other suitable sulfonate PAGs, including benzoin tosylate, t-butylphenyl-α-(p-toluenesulfonyloxyacetate and t-butyl-α-(p-toluenesulfonyloxy) acetate. Onium salts that contain weakly nucleophilic anions have been found to be particularly suitable. Examples of such anions are the halogen complex anions of divalent to heptavalent metals or non-metals, for example, Sb, B, P, and As. Examples of suitable onium salts are aryl-diazonium salts, halonium salts, aromatic sulfonium salts and sulfoxonium salts or selenium salts (e.g., triarylsulfonium and diaryliodonium hexafluoroantimonates, hexafluoroarsenates, trifluoromethanesulfonates and others). One preferred diaryliodonium salt is iodonium perfluorooctanesulfonate (U.S. Pat. No. 6,165,673 to Breyta et al.). Examples of other suitable onium salts can be found in U.S. Pat. No. 4,442,197 to Crivello et al., U.S. Pat. No. 4,603,101 to Crivello, and U.S. Pat. No. 4,624,912 to Zweifel et al. Other useful acid generators include the family of nitrobenzyl esters, and the s-triazine derivatives. Suitable s-triazine acid generators are disclosed, for example, in U.S. Pat. No. 4,189,323 to Buhr.

Still other suitable acid generators include N-camphorsulfonyloxynaphthalimide, N-pentafluorophenylsulfonyloxynaphthalimide, ionic iodonium sulfonates, e.g., diaryl iodonium (alkyl or aryl) sulfonate and bis-(di-t-butylphenyl) iodonium camphanylsulfonate, perfluoroalkanesulfonates, such as perfluoropentanesulfonate, perfluorooctanesulfonate, perfluoromethanesulfonate; aryl (e.g., phenyl or benzyl) triflates and derivatives and analogs thereof, e.g., triphenylsulfonium triflate or bis-(t-butylphenyl)iodonium triflate; pyrogallol derivatives (e.g., trimesylate of pyrogallol); trifluoromethanesulfonate esters of hydroxyimides, α,α-N-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), Chemistry of Materials 3:395, and in U.S. Pat. No. 5,679,495 to Yamachika et al. Additional suitable acid generators useful in conjunction with the compositions and methods provided herein will be known to those skilled in the art and/or are described in the pertinent literature.

Particularly preferred PAGs for use as the "free" PAG in the resist composition are those described in U.S. Patent Publication 2013/0209922 A1, incorporated by reference herein, and particularly preferred are the PAGs corresponding to the PAGs used in the PAG-bound (third) recurring unit, e.g., the third recurring unit having the structure of formula (III-A) or (III-B). These free ionic photoacids comprises a sulfonate salt of an anion selected from the group consisting of and an associated cation.

In addition to the multifunctional polymer, any additional polymer, and free PAG, the resist composition of the invention can further include basic compounds (e.g., as quenchers, acid diffusion controlling additives, and/or stabilizers), solvents, surfactants, dissolution accelerators, adhesion promoters, and anti-foaming agents, as follows:

A wide variety of compounds with varying basicity may be used as stabilizers and acid-diffusion controlling additives. These compounds include nitrogenous compounds such as aliphatic primary, secondary, and tertiary amines; cyclic amines such as piperidines, pyrrolidines, and morpholines; aromatic heterocycles such as pyridines, pyrimidines, and purines; imines such as diazabicycloundecene; guanidines; imides; amides, and others. Ammonium salts may also be used, including ammonium salts per se, primary, secondary, tertiary, and quaternary alkyl- and arylammonium salts of alkoxides, including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

The choice of solvent is governed by many factors including the solubility and miscibility of the resist components, the coating process used, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. The invention is not limited to selection of any particular solvent, although suitable solvents are generally chosen from ether-, ester-, hydroxyl-, and ketone-containing compounds, or mixtures of these compounds. Suitable solvents thus include, without limitation, ketones such as cyclohexanone, cyclopentanone, and methyl n-amyl ketone; alcohols such as 2-ethoxyethanol, 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate (EEP), tert-butyl acetate, tert-butyl propionate, and propylene glycol mono-tert-butyl ether acetate; and lactones such as γ-butyrolactone. These solvents may be used alone or in admixture. Of the aforementioned solvents, ethyl lactate, PGMEA, EEP and mixtures thereof are preferred because the PAG is most soluble therein. The above list of solvents is for illustrative purposes only and should not be viewed as being comprehensive nor should the choice of solvent be viewed as limiting the invention in any way. Those skilled in the art will recognize that any number of solvents or solvent mixtures may be used.

In the resist composition of the invention, the solvent is preferably used in an amount of 1,000 to 10,000 parts by weight, more preferably 2,000 to 9,700 parts by weight, per 100 parts by weight of the overall polymer. When adjusted to such a concentration, the resist composition is applicable by a spin coating technique to form a resist film having a thickness of 10 to 300 nm and an improved flatness in a consistent manner.

Surfactants may be used to improve coating uniformity, and include a wide variety of ionic and non-ionic, monomeric, oligomeric, and polymeric species commonly used for improving coating characteristics, and suitable surfactants will be known to those of ordinary skill in the art. A wide variety of anti-foaming agents may be employed to suppress coating defects. Adhesion promoters may be used as well; again, a wide variety of compounds may be employed to serve this function. A wide variety of monomeric, oligomeric, and polymeric materials such as oligo- and polyethylene glycol ethers, cycloaliphatic esters, and non-acid reactive steroidally derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives will comprise less than 20 wt. % of the solids included in the resist formulation, preferably, less than 5 wt. %.

III. Process

Pattern formation using the resist composition of the invention may be performed by well-known lithography processes. The process generally involves coating, optional post-apply bake, exposure to radiation (typically EB or EUV), post-exposure bake, and development with alkaline developer. The resist composition is first applied onto a cleaned substrate for integrated circuit fabrication. Suitable substrates are generally silicon wafers having a surface layer of silicon (Si), silicon (SiO$_2$), silicon mononitride (SiN), silicon oxynitride (SiON), titanium nitride (TiN), tungsten disilicide (WSi$_2$), borophosphosilicate (BPSG), spin-on glass (SOG), or an organic antireflective coating or the like). The coating is applied to the substrate by any art-known technique, such as spin coating, spray coating, or doctor blading. Preferably, before the film has been exposed to radiation, it is subjected to a post-apply bake step on a hot plate at a temperature of in the range of about 60° C. to about 150° C. for about 1 to 15 minutes, preferably about 80° C. to about 140° C. for about 1 to 10 minutes, to form a resist film having a thickness in the range of about of 15 nm to about 2000 nm, preferably in the range of about 50 nm to about 1000 nm.

The resist film is then pattern-wise exposed to high-energy radiation, such as DUV, EUV, excimer laser, x-ray, or E-beam, i.e., exposed to high-energy radiation through a mask having a desired pattern. The exposure dose is preferably on the order of about 1 mJ/cm$^2$ to about 200 mJ/cm$^2$, more preferably about 10 mJ/cm$^2$ to about 100 mJ/cm$^2$. Alternatively, a pattern is written on the resist film directly with E-beam radiation, in which case the exposure dose is generally in the range of about 1 μC/cm$^2$ to about 400 μC/cm$^2$. The exposed film is then baked in a post-exposure bake step, at a temperature in the range of about 60° C. to about 150° C. for about 1 to 15 minutes, preferably 80° C. to about 140° C. for about 1 to 10 minutes. Thereafter, the resist film is developed with a developer in the form of an aqueous base developer solution, preferably without metal ions, for example, a 0.1 wt % to 5 wt %, preferably a 2 wt % to 3 wt % aqueous solution of tetramethylammonium hydroxide (TMAH) for about 0.1 to about 3 minutes, preferably about 0.5 to 2 minutes, using any suitable technique such as dip, puddle and spray techniques. In this way, a desired resist pattern is formed on the substrate.

One advantage is that the resist film has high etch resistance. Also the resist composition is effective when it is required that the pattern exhibit a minimal change in line width even when the duration between exposure and PEB is prolonged. Because of these advantages, the resist composition is effective in processing a photomask substrate by E-beam lithography. The resist composition is effectively applicable to a processable substrate, specifically a substrate having a surface layer of material to which a resist film is less adherent and which is likely to invite pattern stripping or pattern collapse, and particularly a substrate having sputter deposited thereon a surface layer material susceptible to pattern collapse, typically metallic chromium or a chromium compound containing at least one light element selected from oxygen, nitrogen and carbon. Substrates of this nature are often used in photomask blanks, and the invention is effective for pattern formation on these substrates.

The pattern from the resist structure may then be transferred to the material of the underlying substrate. Typically, the transfer is achieved by reactive ion etching (RIE) or some other etching technique. Thus, the compositions provided herein and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices. Accordingly, the processes for making these features involve, after development with a suitable aqueous base developer as above, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. In the manufacture of integrated circuits, circuit patterns can be formed in the exposed areas after resist development by coating the substrate with a conductive material, e.g., a metallic material, using known techniques such as evaporation, sputtering, plating, chemical vapor deposition, or laser-induced deposition. Dielectric materials may also be deposited by similar means during the process of making circuits. Inorganic ions such as boron, phosphorous, or arsenic can be implanted in the substrate in the process for making p-doped or n-doped circuit transistors. Examples of such processes are disclosed in U.S. Pat. No. 4,855,017 to Douglas; U.S. Pat. No. 5,362,663 to Bronner et al.; U.S. Pat. No. 5,429,710 to Akiba et al.; U.S. Pat. No. 5,562,801 to Nulty; U.S. Pat. No. 5,618,751 to Golden et al.; U.S. Pat. No. 5,744,376 to Chan et al.; U.S. Pat. No. 5,801,094 to Yew et al.; and U.S. Pat. No. 5,821,469 to Shanmugham. Other examples of pattern transfer processes are described in Chapters 12 and 13 of Moreau, Semiconductor Lithography, Principles, Practices, and Materials (Plenum Press, 1988). However, it should be understood that the invention is not limited to any specific lithographic technique or device structure.

As noted above, a resist film of the invention exhibits high etch resistance. Another advantage is that the resist composition is effective in providing a pattern with a narrow line width, i.e., a line width of at most about 60 nm with a resist film thickness of 100 nm or less, even when the length of time between exposure and PEB is prolonged. Because of these advantages, the resist composition is effective in processing a photomask blank by E-beam lithography. In addition, the resist composition can be effectively applied to a processable substrate, specifically a substrate having a surface layer of material to which a resist film is less adherent and likely to result in pattern stripping or pattern collapse. Examples of such substrates are those on which a surface layer material susceptible to pattern collapse has been sputter deposited, typically metallic chromium or a chromium compound containing at least one light element selected from oxygen, nitrogen and carbon. Substrates of this nature are often used in photomask blanks, and the invention is effective for pattern formation on these substrates. Finally, the resist composition of the invention eliminates or minimizes defects seen with prior systems such as that described in US Patent Publication No. 2013/0209922 A1 to Masunaga et al., described and incorporated by reference above. That is, the present composition significantly reduces the number and/or size of the defects as will be shown in the examples below.

IV. Examples

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric. An exception to be noted in this regard is that the compositional ratio of each polymer is indicated on a molar basis, i.e., by mole percent.

All starting materials were obtained commercially or synthesized using known procedures. Where appropriate, the following techniques and equipment were utilized in the Examples: $^1$H and $^{13}$C NMR spectra were obtained at room temperature on an Avance 400 spectrometer. Quantitative $^{13}$C NMR was run at room temperature in acetone-$d_6$ in an inverse-gated $^1$H-decoupled mode using Cr(acac)$_3$ as a relaxation agent on an Avance 400 spectrometer. Thermogravimetric analysis (TGA) was performed at a heating rate of 5° C./min in $N_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) or dimethylformamide (DMF) on a Waters Model 150 chromatograph relative to polystyrene standards. The average molecular weights including weight average molecular weight (Mw) and number average molecular weight (Mn) were determined by gel permeation chromatography (GPC) versus polystyrene standards, from which the Polydispersity Index (Mw/Mn) is computed.

Initially, a terpolymer not containing any PAG-bound recurring units was synthesized for purposes of comparison with multifunctional polymers of the invention, using the method described in Polymer Synthesis Example 1 of US Patent Publication No. 2013/0209922 A1 to Masunaga et al., previously cited and incorporated by reference herein. The polymer so prepared, designated as Polymer 1 herein, had a weight average molecular weight of about 3500, a PDI of 1.58, and contained recurring units of Type (1) (which provides aqueous base solubility), Type (2) (providing polarity switching), and Type (4) (formed from an aromatic ring bearing cyclic olefin monomer) in a 60:30:10 mole ratio:

Polymer 1 Components

Multifunctional polymers of the invention, Polymers 2, 3, 4.1, 4.2, 4.3, 4.4, 4.5, and 5, were synthesized containing different types of recurring units as will be described in detail in the following examples. Table 1 summarizes the composition of each polymer prepared (molecular structures given in the individual examples below), including Polymer 1:

TABLE 1

Polymer Compositions

| Multifunctional polymer no. | Recurring Unit Type, mol % | | | | |
|---|---|---|---|---|---|
| | Type (1) | Type (2) | Type (3A) | Type (3B) | Type (4) |
| 1 (Control) | 60 | 30 | — | — | 10 |
| 2 (Example 1) | 67 | 30 | 3 | — | — |
| 3 (Example 2) | 67 | 30 | — | 3 | — |
| 4.1 (Example 4) | 60 | 22 | 5 | — | 13 |
| 4.2 (Example 5) | 67 | 22 | 2.5 | — | 8.5 |
| 4.3 (Example 6) | 70 | 21 | 1.7 | — | 7.3 |
| 4.4 (Example 3) | 66 | 21.5 | 3.5 | — | 9 |
| 4.5 (Example 7) | 63 | 27.5 | 3.5 | — | 6 |
| 5 (Example 8) | 65 | 21 | — | 3 | 11 |

Example 1

A multifunctional polymer of the invention, Polymer 2, was synthesized from 4-hydroxystyrene (to provide aqueous base solubility), 4-(2-hydroxypropylstyrene) (to provide polarity switching), and triphenylsulfonium 1,1,3,3,3-pentafluoro-2-methacryloyloxypropane-1-sulfonate (PAG-bound unit of formula III-A), as follows:

4-Hydroxystyrene (Monomer 1; 7.18 grams of 22.4 wt % solution in THF, 0.0134 mole, prepared from 4-acetoxystyrene by stirring with ammonium hydroxide in THF), 4-(2-hydroxy-2-propyl)styrene (Monomer 2; 0.972 grams, 0.006 mole), triphenylsulfonium 1,1,3,3,3-pentafluoro-2-methacryloyloxypropane-1-sulfonate (Monomer 3A; 0.336 grams, 0.0006 mole) and 4 grams of MEK (to provide about 25 wt % solids) were placed in a round bottom flask equipped with a condenser and a nitrogen inlet. Monomers 1, 2, and 3 give rise to recurring units of Types (1), (2), and (3A), respectively, i.e., with Type (1) providing aqueous base solubility, Type (2) providing polarity switching, and Type (3) containing covalently bound PAG. 2,2'-Azobisisobutyronitrile (AIBN) (0.132 grams, 0.0008 mole), a polymerization initiator, was added to this solution and stirred until dissolved. The solution was degassed using four vacuum/nitrogen purges, and the contents were then heated to reflux for 18 hours. Afterwards, the solution was added dropwise into hexanes (400 ml). The polymer coagulated, separated by decantation, and dried under vacuum. This dried polymer was dissolved in 25 ml acetone and precipitated into 500 ml DI water. The fine precipitate was filtered through a fine frit funnel and dried under suction. This polymer was again dissolved in 15 ml acetone and precipitated into 300 ml hexanes and filtered. The polymer was dried in vacuum oven at 60° C. Yield: 2.40 grams. Polymer 2 characterization: weight average molecular weight, 5608; Polydispersity Index, 1.58; mole ratio of recurring unit Types (1):(2):(3A) (from Monomers 1:2:3A, respectively), 67:30:3.

Polymer 2 Components

Type (1)

Type (2)

Type (3A)

Example 2

A multifunctional polymer of the invention, Polymer 3, was synthesized using the procedure of Example 1, except that the triphenylsulfonium 1,1,3,3,3-pentafluoro-2-methacryloyloxypropane-1-sulfonate monomer of the preceding example was replaced with a different PAG-bound monomer, to provide the following recurring unit Type (3B) (encompassed by formula III-B):

Type (3B)

As in Example 2, the mole ratio of recurring units of Types 1:2:3B in the polymer was 67:30.03.

Example 3

A multifunctional polymer of the invention, Polymer 4.4, was synthesized from four monomers corresponding to recurring units of Types (1), (2), (3), and (4), as follows:

4-Hydroxystyrene (890 grams of 50.0 wt % solution in PGMEA, 3.71 mole), 4-(2-hydroxy-2-propyl)styrene (310 grams of 54.7 wt % solution in PGMEA, 1.04 mole), acenaphthylene (47.7 grams, 0.313 mole), triphenylsulfonium 1,1,3,3,3-pentafluoro-2-methacryloyloxypropane-1-sulfonate (87.8 grams, 0.157 mole), and dimethyl 2,2'-azobis(2-methylpropionate) (96.1 grams, 0.418 mole) were dissolved in 361 grams of gamma-butyrolactone and 220 grams of PGMEA. 583 Grams of gamma-butyrolactone were placed in a round bottom flask equipped with a condenser and a nitrogen inlet and kept at 80° C. To the flask was gradually added the above monomer solution over 4 hours, and then the solution was stirred for 18 hours at 80° C. Afterwards, the solution was added dropwise into diisopropyl ether (22.5 kg). The polymer coagulated was separated by decantation and dissolved in acetone (2250 g). This polymer solution was precipitated into 22.5 kg of diisopropyl ether and filtered. The polymer was again dissolved in 2250 g acetone and precipitated into 22.5 kg DI water and filtered. The polymer was dried in vacuum oven at 40° C. for 40 hours. Yield of Polymer 4.4: 703 grams.

Recurring units of Types (1), (2), (3A), and (4) in Polymers 4.1 through 4.5:

Type (4)

The letters h, i, j, and k represent the relative number of moles of each type of recurring unit; in Polymer 4.4, the mole ratio of recurring unit Type (1) to Type (2) to Type (3A) to Type (4), as may be represented by h:i:j:k, was 66:21.5:3.5:9.0. Note that neither the structural representation of the units nor the aforementioned letter designations are intended to imply the structure of or order of units in the multifunctional polymer.

Example 4

The procedure of Example 3 was repeated except that the mole ratio of the four monomers and thus the mole ratio of the four recurring units in the polymer h:i:j:k was 60:22:5:13. The polymer so prepared is designated Polymer 4.1 herein.

Example 5

The procedure of Example 3 was repeated except that the mole ratio of the four monomers and thus the mole ratio of the four recurring units in the polymer h:i:j:k was 67:22:2.5:8.5. The polymer so prepared is designated Polymer 4.2 herein.

Example 6

The procedure of Example 3 was repeated except that the mole ratio of the four monomers and thus the mole ratio of the four recurring units in the polymer h:i:j:k was 70:21:1.7:7.3. The polymer so prepared is designated Polymer 4.3 herein.

Example 7

The procedure of Example 3 was repeated except that the mole ratio of the four monomers and thus the mole ratio of the four recurring units in the polymer h:i:j:k was 63:27.5:3.5:6. The polymer so prepared is designated Polymer 4.5 herein.

Example 8

The procedure of Example 3 was repeated except that the PAG-bound monomer of Example 2 was substituted for triphenylsulfonium 1,1,3,3,3-pentafluoro-2-methacryloyloxypropane-1-sulfonate, and the mole ratio of the four types of monomers was altered.

Recurring units of Types (1), (2), (3B), and (4) in Polymer 5:

Type (1)

-continued

Type (2)

Type (3B)

Type (4)

In Polymer 5, the mole ratio of recurring unit Type (1) to Type (2) to Type (3B) to Type (4), as may be represented by r:s:t:u, was 65:21:3:11. (Again, it should be noted that neither the structural representations nor the letter designations are intended to imply the structure of or order of units in the multifunctional polymer.) Example 9

Negative-tone resist compositions were prepared by dissolving a polymer selected from Polymers 1, 2, 3, 4.1 through 4.5, 5, and mixtures thereof, in an organic solvent mixture, along with free (unbound) PAG, Base 1 and/or Base 2, and a surfactant in accordance with Table 2. Prior to use, the resist compositions were each filtered through a Teflon® filter having a pore size of 0.2 μm or smaller. For comparison, a formulation with non-bound PAG Polymer 1 is presented in Table 3.

The weight ratio of each component is indicated in parentheses in the tables. Abbreviations and additive structures are as follows:

EL: Ethyl lactate
PGMEA: Propylene glycol monomethyl ether acetate
PF-636: PolyFox® PF-636, a fluorinated nonionic polyoxyethylene diol surfactant (Omnova Solutions, Fairlawn Ohio)

PAG-1

PAG-2

Base-1

Base-2

TABLE 2

Resist Compositions

| Resist No. | Polymer(s) | Free PAG | Additive-1 | Additive-2 | Surfactant | Solvent-1 | Solvent-2 |
|---|---|---|---|---|---|---|---|
| 1 | Polymer 4.1 (80) | — | Base-1 (1.00) | — | PF-636 (0.075) | Cyclohexanone (2880) | — |
| 2 | Polymer 5 (80) | — | Base-1 (0.77) | — | PF-636 (0.075) | EL (2720) | — |
| 3 | Polymer 4.2 (80) | — | Base-1( 0.82) | — | PF-636 (0.075) | EL (1708) | PGMEA (732) |
| 4 | Polymer 4.3 (80) | — | Base-1 (0.72) | — | PF-636 (0.075) | EL (1708) | PGMEA (732) |
| 5 | Polymer 4.2 (80) | PAG-2 (2) | Base-1 (0.815) | — | — | EL (1708) | PGMEA (732) |
| 6 | Polymer 4.4 (80) | — | Base-1 (1.00) | — | — | EL (1708) | PGMEA (732) |
| 7 | Polymer 4.5 (80) | — | Base-1 (1.135) | — | — | EL (1708) | PGMEA (732) |
| 8 | Polymer 4.4 (80) | PAG-1 (2) | Base-1 (0.983) | — | — | EL (1708) | PGMEA (732) |
| 9 | Polymer 4.5 (80) | PAG-1 (2) | Base-1 (1.135) | — | — | EL (1708) | PGMEA (732) |
| 10 | Polymer 4.4 (80) | — | Base-1 (0.80) | — | — | EL (1708) | PGMEA (732) |

TABLE 2-continued

Resist Compositions

| Resist No. | Polymer(s) | Free PAG | Additive-1 | Additive-2 | Surfactant | Solvent-1 | Solvent-2 |
|---|---|---|---|---|---|---|---|
| 11 | Polymer 4.4 (56) Polymer 1 (24) | PAG-1 (2) | Base-1 (0.86) | Base-2 (0.3) | — | EL (1708) | PGMEA (732) |
| 12 | Polymer 4.4 (56) Polymer 1 (24) | PAG-1 (3) | Base-1 (0.86) | Base-2 (0.3) | — | EL (1708) | PGMEA (732) |
| 13 | Polymer 4.4 (40) Polymer 1 (40) | PAG-1 (3) | Base-1 (0.70) | Base-2 (0.3) | — | EL (1708) | PGMEA (732) |
| 14 | Polymer 4.4 (40) Polymer 1 (40) | PAG-1 (5) | Base-1 (0.70) | Base-2 (0.3) | — | EL (1708) | PGMEA (732) |
| 15 | Polymer 4.2 (80) | PAG-1 (2) | Base-1 (0.75) | Base-2 (0.3) | — | EL (1708) | PGMEA (732) |
| 16 | Polymer 4.4 (80) | PAG-1 (2) | Base-1 (0.75) | Base-2 (0.3) | — | EL (1708) | PGMEA (732) |
| 17 | Polymer 4.4 (40) Polymer 1 (40) | PAG-1 (7) | Base-1 (0.83) | Base-2 (0.3) | — | EL (1708) | PGMEA (732) |
| 18 | Polymer 4.4 (40) Polymer 1 (40) | PAG-1 (10) | Base-1 (0.95) | Base-2 (0.3) | — | EL (1708) | PGMEA (732) |
| 19 | Polymer 4.4 (24) Polymer 1 (56) | PAG-1 (7) | Base-1 (0.77) | Base-2 (0.3) | — | EL (1708) | PGMEA (732) |
| 20 | Polymer 4.4 (24) Polymer 1 (56) | PAG-1 (10) | Base-1 (0.89) | Base-2 (0.3) | — | EL (1708) | PGMEA (732) |
| 21 | Polymer 4.4 (40) Polymer 1 (40) | PAG-1 (3) | Base-1 (0.87) | — | — | EL (1708) | PGMEA (732) |
| 22 | Polymer 4.4 (40) Polymer 1 (40) | PAG-1 (5) | Base-1 (1.0) | — | — | EL (1708) | PGMEA (732) |
| 23 | Polymer 4.4 (56) Polymer 1 (24) | PAG-1 (3) | Base-1 (1.0) | — | — | EL (1708) | PGMEA (732) |
| 24 | Polymer 4.4 (50) Polymer 1 (30) | PAG-1 (3) | Base-1 (0.89) | — | — | EL (1708) | PGMEA (732) |

TABLE 3

Comparative Resist Example with Non-Bound-PAG Polymer 1

| Resist No. | Polymer(s) | Free PAG | Additive-1 | Additive-2 | Surfactant | Solvent-1 | Solvent-2 |
|---|---|---|---|---|---|---|---|
| CTRL | Polymer 1 (80) | PAG-1 (10) | Base-1 (1.0) | — | PF-636 (0.075) | EL (1708) | PGMEA (732) |

Example 10

Resist Processing on a Silicon Wafer (E-Beam and EUV):

To test resolution and imaging quality of the resist compositions of Tables 2 and 3, the resist composition was spin coated onto silicon wafers to a predetermined thickness, of 40 nm, 70 nm or 125 nm. A BARC underlayer was used for adhesion purposes. The wafer was then post-apply baked at 110° C. for 10 minutes on a hot plate with laminar $N_2$ flow. E-beam exposures were done with a 100 KeV Leica VB6 at variable doses. The wafer was then post-exposure baked at 120° C. for 10 minutes. Both bakes were done in contact mode. A 60-second development of the resist was carried out using a gentle spray to puddle followed by water rinse and spin dry. Top and cross sectional images were inspected using a LEO Carl Zeiss SEM tool. Cross sectional samples were coated with thin PdAu to avoid sample charging.

Figure 1:
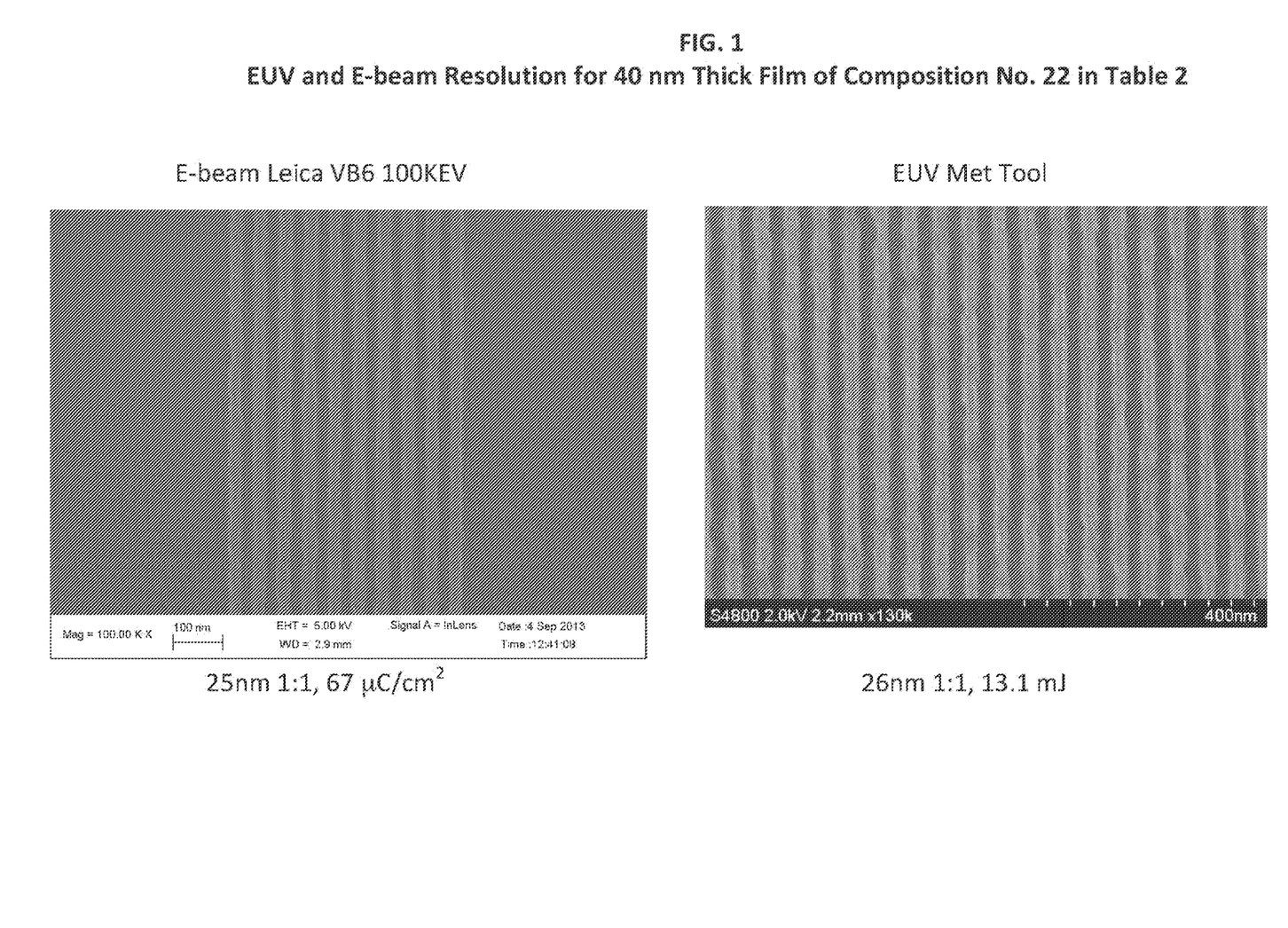
FIG. 1 shows the lithographic performance of resist composition 22 in Table 2, under E-beam and EUV exposure conditions.

In a separate experiment, the wafers were exposed on a 0.3-NA extreme ultraviolet (EUV) Micro Exposure Tool (MET) and processed as described above. SEM images for resist composition number 22 in Table 2 are presented in FIG. 1.

Example 11

Resist Processing on Photomask Blanks:

Resist performance on a 50 keV E-beam tool (NuFlare EBM-5000+) for the compositions of Table 2, Entries 10-14 and Table 3 (for purposes of comparison) using a coating thickness of 70 nm on a photomask blank is summarized in Table 4. The processing conditions were similar to as described in Example 10. In the table, the abbreviations are as follows: LS—line/space (1:1); IL—isolated line; IS—isolated space and LER—line edge roughness.

TABLE 4

Resist Performance (70 nm thickness)

| Resist Composition | LS Dose ($\mu C/cm^2$) | LER (nm) | Highest resolution (nm) | | |
|---|---|---|---|---|---|
| | | | LS | IL | IS |
| Table 3, Entry 1 | 25.7 | 6.5 | 50 | 50 | 50 |
| Table 2, Entry 10 | 27.0 | 7.9 | 60 | 50 | 50 |
| Table 2, Entry 11 | 28.3 | 7.8 | 55 | 50 | 50 |
| Table 2, Entry 12 | 28.5 | 6.1 | 45 | 50 | 50 |
| Table 2, Entry 13 | 25.1 | 7.0 | 45 | 45 | 45 |
| Table 2, Entry 14 | 21.9 | 6.1 | 45 | 45 | 45 |

Resist performance was then evaluated under the same exposure and processing conditions for the compositions of Table 2, Entries 17-20 and Table 3, using a coating thickness of 125 nm, as indicated in Table 5:

TABLE 5

Resist Performance (125 nm thickness)

| Resist Composition | LS Dose ($\mu C/cm^2$) | LER (nm) | Highest resolution (nm) | | |
|---|---|---|---|---|---|
| | | | LS | IL | IS |
| Table 3, Entry 1 | 26.2 | 5.0 | 40 | 40 | 50 |
| Table 2, Entry 17 | 23.2 | 4.8 | 40 | 40 | 55 |
| Table 2, Entry 18 | 23.5 | 4.8 | 40 | 40 | 55 |
| Table 2, Entry 19 | 23.8 | 5.1 | 40 | 40 | 50 |
| Table 2, Entry 20 | 23.8 | 4.8 | 40 | 40 | 50 |

Example 12

Blob Defect Study:

Mask defect study of the resist formulations was carried out on resist coated mask blanks. A test pattern was designed which included a large exposed region and two chrome regions that had been unexposed. The mask was then exposed on a 50 keV E-beam tool (NuFlare EBM-5000+) and developed as described in Example 11. The unexposed regions were then inspected on a mask defect inspection tool (Lasertec M2351 Reticle Inspection tool).

Figure 2:
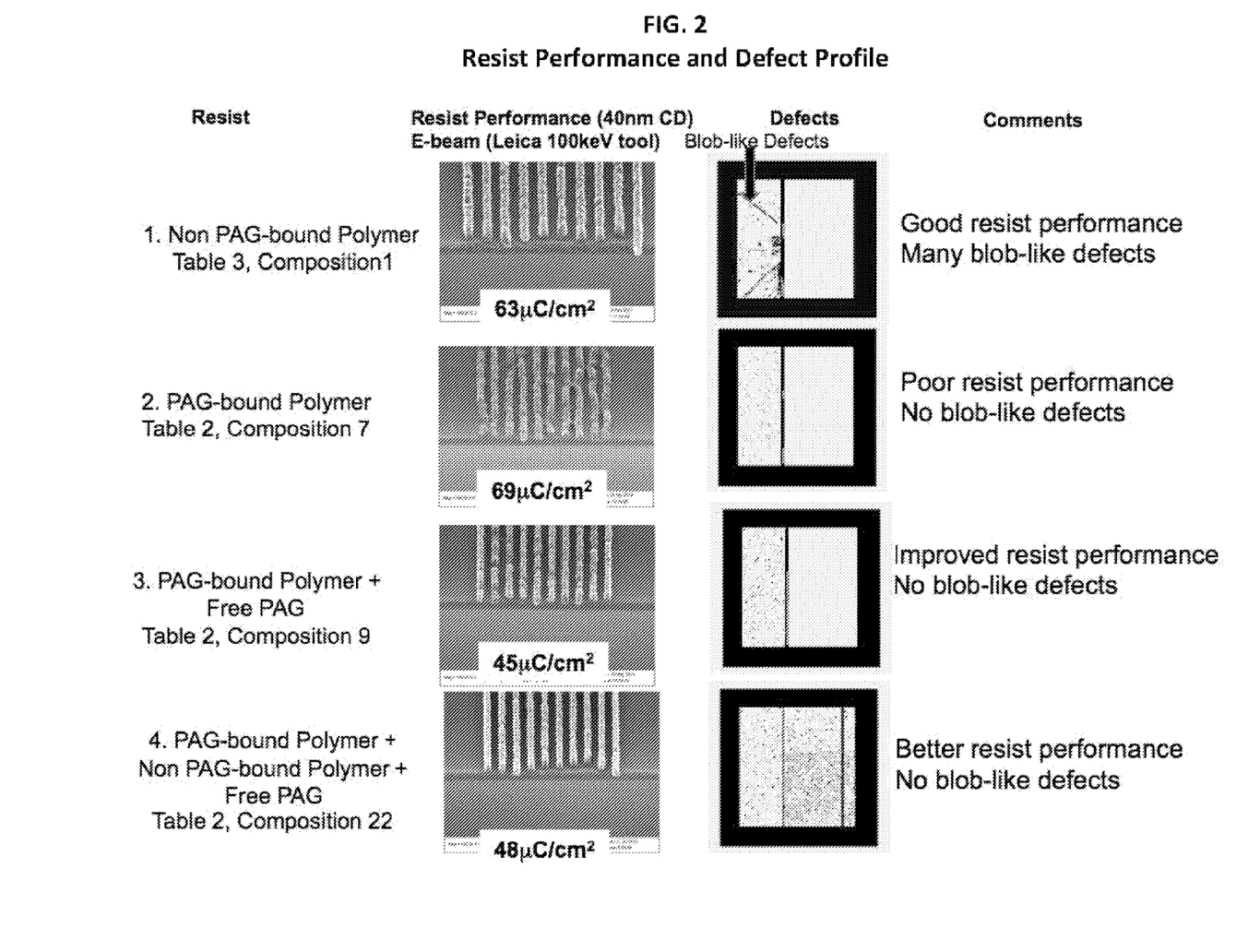
FIG. 2 illustrates the resist performance and defect profile of three resist compositions of the invention (Table 2, entries 7, 9, and 22) as compared with control compositions not containing PAG-bound polymer (Table 3).

The results of the mask defect study and the imaging performance on a wafer for the compositions of Table 2, Entries 7, 9, and 22, and Table 3 are presented in FIG. 2.

Results: The resist formulations containing PAG-bound polymers did not show any "blob" defects when patterned on a mask substrate with E-beam radiation. However, the lithographic performance of these formulations on a wafer, i.e., resolution and LER, was inferior to the lithographic performance of the formulations with non-PAG-bound polymers (see, for example, FIG. 2, entry 2, versus FIG. 2, entry 1). Addition of free PAG in the range of about 1 wt. % to about 12.5 wt. % was found to improve lithographic performance without reappearance of the defects (see, as an example, (FIG. 2, entry 3 versus entries 1 and 2). Further improvement was achieved by the blending of a PAG-bound polymers with a non-PAG-bound polymers and free PAG (see FIG. 2, entry 4). When more than 12.5 wt. % of free PAG was added, blob defects started to reappear.

The invention claimed is:

1. A resist composition, comprising:
    a first polymer, comprising:
    (a) about 50 mol % to about 80 mol % first recurring units of a type (I), the type (I) providing aqueous base solubility and comprising an aqueous base soluble functionality selected from phenols and fluoroalcohols, wherein the first recurring units of the first polymer have the structure of formula (I)

(I)

wherein:
R$^1$ is selected from H, fluoro, C$_1$-C$_3$ alkyl, and fluorinated C$_1$-C$_3$ alkyl;

R$^2$ is selected from fluoro, hydroxyl, C$_1$-C$_3$ alkyl, and fluorinated C$_1$-C$_3$ alkyl; and m is an integer in the range of 1 to 4 inclusive, wherein when m is greater than 1, the R$^2$ may be the same or different;

(b) about 10 mol % to about 40 mol % second recurring units of a type (II), the type (II) containing a polarity switching functionality that converts from a polar group to a nonpolar group in the absence of a cross-linking agent and in the presence of a polymer-bound acid generated upon exposure of the polymer to radiation, wherein the second recurring units of the first polymer have the structure of formula (II-B):

(II-B)

wherein:
R$^3$ and R$^4$ are C$_1$-C$_{10}$ alkyl;

R$^5$ is selected from H, fluoro, C$_1$-C$_3$ alkyl, and fluorinated C$_1$-C$_3$ alkyl;

R$^6$ is selected from fluoro, hydroxyl, C$_1$-C$_3$ alkyl, and fluorinated C$_1$-C$_3$ alkyl; and t is zero, 1, or 2;

(c) about 1 mol % to about 10 mol % third recurring units of a type (III), the type (III) containing a covalently-bound photoacid-generating group that generates the polymer-bound acid upon exposure to radiation, wherein the third recurring units of the first polymer have the structure of formula (III-A) or (III-B)

(III-A)

wherein:
R⁷ and R⁸ are independently selected from H, fluoro, and fluorinated $C_1$-$C_3$ alkyl;
R⁹, R¹⁰, and R¹¹ are independently selected from $C_1$-$C_{10}$ alkyl, $C_2$-$C_{10}$ alkenyl, $C_6$-$C_{18}$ aryl, and $C_7$-$C_{24}$ aralkyl, or two or three of R⁹, R¹⁰, and R¹¹ may be taken together to form a ring;
R¹² is selected from H, fluoro, hydroxyl, $C_1$-$C_3$ alkyl, and fluorinated $C_1$-$C_3$ alkyl;
R¹³ is selected from H, fluoro, hydroxyl, $C_1$-$C_3$ alkyl, and fluorinated $C_1$-$C_3$ alkyl;
R¹⁴, R¹⁵, and R¹⁶ are independently selected from $C_1$-$C_{10}$ alkyl, $C_2$-$C_{10}$ alkenyl, $C_6$-$C_{18}$ aryl, and $C_7$-$C_{24}$ aralkyl, or two or three of R⁹, R¹⁰, and R¹¹ may be taken together to form a ring;
W is selected from $C_1$-$C_{10}$ alkylene and $C_6$-$C_{18}$ arylene; and
Z is a $C_1$-$C_{10}$ divalent hydrocarbon group that is optionally substituted with F or $CF_3$;
(d) about 1 mol % to about 15 mol % fourth recurring units of a type (IV), the type (IV) containing groups derived from an aromatic ring bearing cyclic olefin monomer, wherein:
the fourth recurring units of the first polymer have the structure of formula (IV):

wherein:
f and g are independently 1 to 3; and
R¹⁷ and R¹⁸ are independently selected from fluoro, hydroxyl, $C_1$-$C_3$ alkyl, and fluorinated $C_1$-$C_3$ alkyl; and
wherein the first polymer has a weight average molecular weight in the range of 1,000 to 20,000 and a Polydispersity Index in the range of 1.0 to 2.5;
a second polymer, consisting essentially of:
(a) about 50 mol % to about 80 mol % first recurring units of the type (I);
(b) about 10 mol % to about 40 mol % second recurring units of the type (II); and
(d) third recurring units of the type (IV); and
a free ionic photoacid generator having a sulfonate ion, wherein the free ionic photoacid generator is present in an amount that represents about 1 wt. % to about 12.5 wt. % of the resist composition, and further wherein the resist composition is substantially free of cross-linking agents.

2. The resist composition of claim 1, wherein the first recurring units of the second polymer have the structure of formula (I).

3. The resist composition of claim 2, wherein, at the first recurring units of the second polymer:
R¹ is H, m is zero (such that the unit derives from 4-hydroxystyrene);
R¹ is H, m is 1, and R² is o-methyl;
R¹ is H, m is 1, and R² is m-methyl;
R¹ is H, m is 2, and the R² are 3,5-dimethyl;
R¹ is H, m is 2, and the R² are 3,5-di(trifluoromethyl);
R¹ is F, m is zero;
R¹ is F, m is 1, and R² is o-methyl;
R¹ is F, m is 1, and R² is m-methyl;
R¹ is F, m is 2, and the R² are 3,5-dimethyl;
R¹ is F, m is 2, and the R² are 3,5-di(trifluoromethyl);
R¹ is $CH_3$, m is zero;
R¹ is $CH_3$, m is 1, and R² is o-methyl;
R¹ is $CH_3$, m is 1, and R² is m-methyl;
R¹ is $CH_3$, m is 2, and the R² are 3,5-dimethyl;
R¹ is $CH_3$, m is 2, and the R² are 3,5-di(trifluoromethyl);
R¹ is $CF_3$, m is zero;
R¹ is $CF_3$, m is 1, and R² is o-methyl;
R¹ is $CF_3$, m is 1, and R² is m-methyl;
R¹ is $CF_3$, m is 2, and the R² are 3,5-dimethyl; or
R¹ is $CF_3$, m is 2, and the R² are 3,5-di(trifluoromethyl).

4. The resist composition of claim 1, wherein the second recurring units of the second polymer have the structure of formula (II)

wherein:
n, p, and q are independently selected from zero and 1;
R³ is $C_1$-$C_{15}$ alkyl and R⁴ is either H or $C_1$-$C_{15}$ alkyl, or R³ and R⁴ taken together form a cyclic group;
R⁵ is selected from H, fluoro, $C_1$-$C_3$ alkyl, and fluorinated $C_1$-$C_3$ alkyl;
X and Y are independently selected from $C_1$-$C_{10}$ alkylene and heteroatom-containing $C_1$-$C_{10}$ alkylene; and
Ar is an arylene moiety.

5. The resist composition of claim 4, wherein n, p, and q are zero and Ar is optionally substituted phenylene, such that the second recurring units of the second polymer have the structure of formula (II-B)

(II-B)

wherein:
R3 and R4 are C1-C10 alkyl;
R6 is selected from fluoro, hydroxyl, C1-C3 alkyl, and fluorinated C1-C3 alkyl; and
t is zero, 1, or 2.

6. The resist composition of claim 1, wherein t is zero, $R^3$ and $R^4$ are methyl, and $R^5$ is H.

7. The resist composition of claim 1, further comprising a second species of free ionic photoacid generator.

8. The resist composition of claim 1, wherein, at the first recurring units of the first polymer:
$R^1$ is H, m is zero (such that the unit derives from 4-hydroxystyrene);
$R^1$ is H, m is 1, and $R^2$ is o-methyl;
$R^1$ is H, m is 1, and $R^2$ is m-methyl;
$R^1$ is H, m is 2, and the $R^2$ are 3,5-dimethyl;
$R^1$ is H, m is 2, and the $R^2$ are 3,5-di(trifluoromethyl);
$R^1$ is F, m is zero;
$R^1$ is F, m is 1, and $R^2$ is o-methyl;
$R^1$ is F, m is 1, and $R^2$ is m-methyl;
$R^1$ is F, m is 2, and the $R^2$ are 3,5-dimethyl;
$R^1$ is F, m is 2, and the $R^2$ are 3,5-di(trifluoromethyl);
$R^1$ is $CH_3$, m is zero;
$R^1$ is $CH_3$, m is 1, and $R^2$ is o-methyl;
$R^1$ is $CH_3$, m is 1, and $R^2$ is m-methyl;
$R^1$ is $CH_3$, m is 2, and the $R^2$ are 3,5-dimethyl;
$R^1$ is $CH_3$, m is 2, and the $R^2$ are 3,5-di(trifluoromethyl);
$R^1$ is $CF_3$, m is zero;
$R^1$ is $CF_3$, m is 1, and $R^2$ is o-methyl;
$R^1$ is $CF_3$, m is 1, and $R^2$ is m-methyl;
$R^1$ is $CF_3$, m is 2, and the $R^2$ are 3,5-dimethyl; or
$R^1$ is $CF_3$, m is 2, and the $R^2$ are 3,5-di(trifluoromethyl).

9. A resist composition, comprising:
a first polymer, comprising:
(a) about 50 mol % to about 80 mol % first recurring units of a type (I), the type (I) providing aqueous base solubility and comprising an aqueous base soluble functionality selected from phenols, fluoroalcohols, and sulfonamides;
(b) about 10 mol % to about 40 mol % second recurring units of a type (II), the type (II) containing a polarity switching functionality that converts from a polar group to a nonpolar group;
(c) about 1 mol % to about 10 mol % third recurring units of a type (III), the type (III) containing a photoacid-generating group that generates a polymer-bound acid upon exposure of the polymer to radiation; and
(d) optionally, fourth recurring units of a type (IV), the type (IV) containing groups derived from an aromatic ring bearing cyclic olefin monomer;
a second polymer, consisting essentially of:
(a) about 50 mol % to about 80 mol % first recurring units of the type (I);
(b) about 10 mol % to about 40 mol % second recurring units of the type (II); and
(d) optionally, third recurring units of the type (IV); and
a free ionic photoacid generator having a sulfonate ion, wherein the free ionic photoacid generator is present in an amount that represents about 1 wt. % to about 12.5 wt. % of the resist composition,
and further wherein the resist composition is substantially free of cross-linking agents.

* * * * *